(12) United States Patent
Xiang et al.

(10) Patent No.: US 9,741,563 B2
(45) Date of Patent: Aug. 22, 2017

(54) HYBRID STAIR-STEP ETCH

(71) Applicant: Lam Research Corporation, Fremont, CA (US)

(72) Inventors: Hua Xiang, Pleasanton, CA (US); Indeog Bae, San Ramon, CA (US); Sung Jin Jung, San Ramon, CA (US); Ce Qin, Fremont, CA (US); Qian Fu, Pleasanton, CA (US); Yoko Yamaguchi, Union City, CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 15/008,328

(22) Filed: Jan. 27, 2016

(65) Prior Publication Data

US 2017/0213723 A1    Jul. 27, 2017

(51) Int. Cl.
| | | |
|---|---|---|
| *H01L 21/027* | (2006.01) | |
| *H01L 21/311* | (2006.01) | |
| *H01L 21/304* | (2006.01) | |
| *H01L 21/3065* | (2006.01) | |
| *H01L 21/308* | (2006.01) | |
| *H01L 21/033* | (2006.01) | |
| *H01L 27/11578* | (2017.01) | |
| *H01L 27/11551* | (2017.01) | |

(52) U.S. Cl.
CPC ...... *H01L 21/0273* (2013.01); *H01L 21/0337* (2013.01); *H01L 21/304* (2013.01); *H01L 21/308* (2013.01); *H01L 21/3065* (2013.01); *H01L 21/3086* (2013.01); *H01L 21/31111* (2013.01); *H01L 21/31144* (2013.01); *H01L 27/11551* (2013.01); *H01L 27/11578* (2013.01)

(58) Field of Classification Search
None
See application file for complete search history.

(56) References Cited

U.S. PATENT DOCUMENTS

| | | | |
|---|---|---|---|
| 5,532,089 | A | 7/1996 | Adair et al. |
| 5,738,757 | A | 4/1998 | Burns et al. |
| 5,773,368 | A | 6/1998 | Moran |

(Continued)

FOREIGN PATENT DOCUMENTS

| | | |
|---|---|---|
| JP | 2000-91308 | 3/2000 |
| KR | 10-2014-0001948 | 1/2014 |

(Continued)

OTHER PUBLICATIONS

International Search Report dated Apr. 2, 2012 from International Application No. PCT/US11/61965.

(Continued)

*Primary Examiner* — Jiong-Ping Lu
(74) *Attorney, Agent, or Firm* — Beyer Law Group LLP

(57) ABSTRACT

A method for forming a stair-step structure in a substrate is provided, wherein the substrate has an organic mask, comprising at least one cycle, wherein each cycle comprises a) depositing a hardmask over the organic mask, b) trimming the organic mask, c) etching the substrate, d) trimming the organic mask, wherein there is no depositing a hardmask between etching the substrate and trimming the organic mask, e) etching the substrate, and f) repeating steps a-e a plurality of times forming the stair-step structure.

18 Claims, 8 Drawing Sheets

(56) References Cited

U.S. PATENT DOCUMENTS

| | | | |
|---|---|---|---|
| 6,043,119 A | 3/2000 | Wu et al. | |
| 6,159,823 A | 12/2000 | Song et al. | |
| 6,239,035 B1 | 5/2001 | Harris | |
| 6,417,108 B1 | 7/2002 | Akino et al. | |
| 6,727,158 B2 | 4/2004 | Sundt et al. | |
| 6,833,327 B2 | 12/2004 | Ishikawa | |
| 7,396,711 B2 | 7/2008 | Shah et al. | |
| 7,786,020 B1 | 8/2010 | Kang et al. | |
| 8,242,024 B2 | 8/2012 | Chen | |
| 8,263,496 B1 | 9/2012 | Wodecki | |
| 8,492,824 B2 | 7/2013 | Yahashi | |
| 8,530,350 B2 | 9/2013 | Freeman et al. | |
| 8,535,549 B2 | 9/2013 | Fu et al. | |
| 8,564,050 B2 | 10/2013 | Park et al. | |
| 8,569,182 B2 | 10/2013 | Park et al. | |
| 8,704,288 B2 | 4/2014 | Lee et al. | |
| 8,907,707 B2 | 12/2014 | Cooke | |
| 9,048,193 B2 | 6/2015 | Oh et al. | |
| 2002/0052098 A1 | 5/2002 | Chang et al. | |
| 2002/0166838 A1 | 11/2002 | Nagarajan | |
| 2005/0045951 A1 | 3/2005 | Yamada et al. | |
| 2005/0095741 A1 | 5/2005 | Johnstone et al. | |
| 2005/0255668 A1 | 11/2005 | Tseng et al. | |
| 2006/0019443 A1 | 1/2006 | Kim et al. | |
| 2007/0023916 A1 | 2/2007 | Hah et al. | |
| 2007/0065966 A1 | 3/2007 | Chinthakindi et al. | |
| 2007/0252201 A1 | 11/2007 | Kito et al. | |
| 2008/0050919 A1 | 2/2008 | Van Aelst et al. | |
| 2008/0073635 A1 | 3/2008 | Kiyotoshi et al. | |
| 2008/0197109 A1 | 8/2008 | Mui et al. | |
| 2008/0265311 A1 | 10/2008 | Tang et al. | |
| 2008/0296736 A1* | 12/2008 | Fu | H01L 21/32136 257/622 |
| 2009/0310415 A1 | 12/2009 | Jin et al. | |
| 2010/0117143 A1 | 5/2010 | Lee et al. | |
| 2010/0133599 A1 | 6/2010 | Chae | |
| 2010/0173498 A1 | 7/2010 | Abatchev et al. | |
| 2010/0176440 A1 | 7/2010 | Omura | |
| 2010/0178771 A1 | 7/2010 | Oh et al. | |
| 2010/0213526 A1 | 8/2010 | Wada et al. | |
| 2010/0248457 A1 | 9/2010 | Shin et al. | |
| 2010/0323505 A1 | 12/2010 | Ishikawa et al. | |
| 2011/0031630 A1 | 2/2011 | Hashimoto | |
| 2011/0092038 A1 | 4/2011 | Choi et al. | |
| 2011/0108907 A1 | 5/2011 | Maeda | |
| 2011/0163420 A1 | 7/2011 | Valdivia et al. | |
| 2011/0169067 A1 | 7/2011 | Ernst et al. | |
| 2011/0201167 A1 | 8/2011 | Satonaka et al. | |
| 2011/0204421 A1 | 8/2011 | Choi et al. | |
| 2011/0284946 A1 | 11/2011 | Kiyotoshi | |
| 2012/0003831 A1 | 1/2012 | Kang et al. | |
| 2012/0119287 A1 | 5/2012 | Park et al. | |
| 2012/0149201 A1* | 6/2012 | Fu | H01L 21/31144 438/696 |
| 2012/0149203 A1 | 6/2012 | Fu et al. | |
| 2012/0171861 A1 | 7/2012 | Park et al. | |
| 2012/0187471 A1 | 7/2012 | Yu et al. | |
| 2012/0306089 A1 | 12/2012 | Freeman et al. | |
| 2012/0319173 A1 | 12/2012 | Ko et al. | |
| 2013/0056818 A1 | 3/2013 | Iino et al. | |
| 2013/0062683 A1 | 3/2013 | Fukuzumi et al. | |
| 2013/0161821 A1 | 6/2013 | Hwang et al. | |
| 2013/0234232 A1 | 9/2013 | Yahashi | |
| 2014/0054789 A1 | 2/2014 | Chiu et al. | |
| 2014/0057429 A1* | 2/2014 | Oh | H01L 21/308 438/613 |

FOREIGN PATENT DOCUMENTS

| | | |
|---|---|---|
| TW | 200402087 | 2/2004 |
| TW | 201005954 | 2/2010 |

OTHER PUBLICATIONS

Written Opinion dated Apr. 2, 2012 from International Application No. PCT/US11/61965.
Notice of Allowance dated Sep. 26, 2012 from U.S. Appl. No. 12/968,210.
Office Action dated Sep. 24, 2014 from U.S. Appl. No. 13/668,939.
Notification of Examination Opinions date Nov. 20, 2015 from Taiwan Patent Application No. 100146204.
Office Action dated May 21, 2015 from U.S. Appl. No. 14/581,673.
Notice of Allowance dated Dec. 18, 2015 from U.S. Appl. No. 14/581,673.

* cited by examiner

HYBRID STAIR-STEP ETCH

BACKGROUND

The present disclosure relates to the formation of semiconductor devices. More specifically, the disclosure relates to the formation of stair-step semiconductor devices.

During semiconductor wafer processing, stair-step features are sometimes required. For example, in 3D flash memory devices, multiple cells are stacked up together in chain format to save space and increase packing density. The stair-step structure allows electrical contact with every gate layer.

U.S. Pat. No. 8,535,549, by Fu et al. issued on Sep. 17, 2013, which is incorporated by reference for all purposes, discloses the deposition of a hardmask over an organic mask in forming a stair-step structure.

SUMMARY

To achieve the foregoing and in accordance with the purpose of the present disclosure, a method for forming a stair-step structure in a substrate is provided, wherein the substrate has an organic mask, comprising at least one cycle, wherein each cycle comprises a) depositing a hardmask over the organic mask, b) trimming the organic mask, c) etching the substrate, d) trimming the organic mask, wherein there is no depositing a hardmask between etching the substrate and trimming the organic mask, e) etching the substrate, and f) repeating steps a-e a plurality of times forming the stair-step structure.

In another manifestation, a method for making a three dimensional memory structure from a memory stack comprising a plurality of layers, wherein each layer comprises at least two sublayers with an organic mask is over the memory stack is provided. a) A hardmask is deposited over a top of the organic mask. b) The organic mask is trimmed. c) The memory stack is etched, so that portions of the memory stack not covered by the organic mask are etched. d) The organic mask is trimmed, wherein there is no depositing a hardmask between steps c and d. e) The memory stack is etched. f) Steps a-e are repeated a plurality of times forming the three dimensional memory structure.

In another manifestation, a method for forming a stair-step structure in a substrate in a plasma processing chamber, wherein the substrate has an organic mask is provided. At least one cycle is provided, wherein the at least one cycle comprises a protected etch phase and an unprotected etch phase.

These and other features of the present disclosure will be described in more detail below in the detailed description of the disclosure and in conjunction with the following figures.

BRIEF DESCRIPTION OF THE DRAWINGS

The present disclosure is illustrated by way of example, and not by way of limitation, in the figures of the accompanying drawings and in which like reference numerals refer to similar elements and in which.

DETAILED DESCRIPTION OF THE PREFERRED EMBODIMENTS

The present disclosure will now be described in detail with reference to a few preferred embodiments thereof as illustrated in the accompanying drawings. In the following description, numerous specific details are set forth in order to provide a thorough understanding of the present disclosure. It will be apparent, however, to one skilled in the art, that the present disclosure may be practiced without some or all of these specific details. In other instances, well known process steps and/or structures have not been described in detail in order to not unnecessarily obscure the present disclosure.

Figure 1:
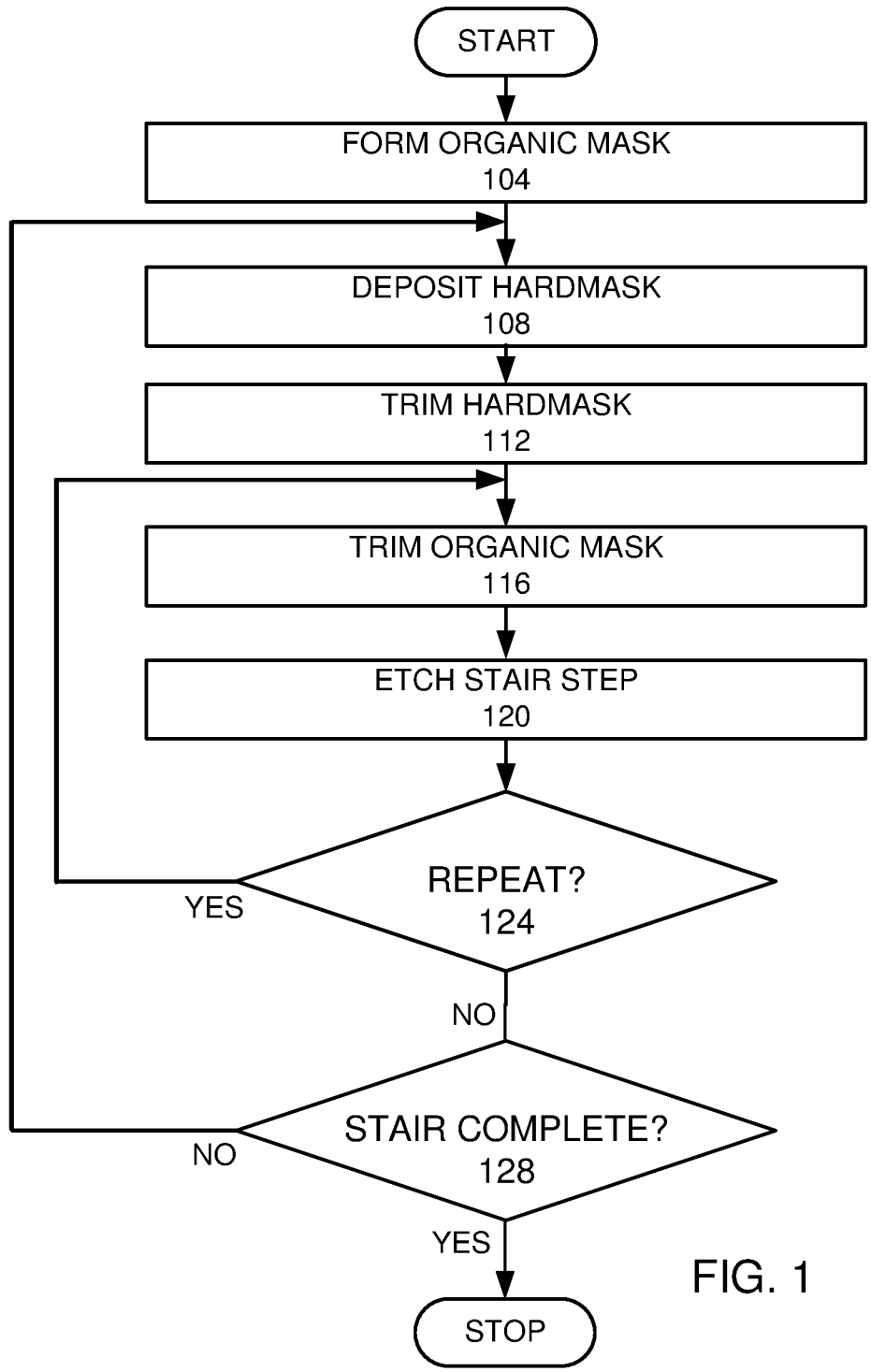
FIG. 1 is a high level flow chart of a process that may be used in an embodiment of the disclosure.

To facilitate understanding, FIG. 1 is a high level flow chart of a process that may be used in an embodiment of the disclosure, which forms a stair-step structure in a substrate. An organic mask is formed over a substrate (step 104). A hardmask is deposited over the organic mask (step 108). The hardmask is trimmed (step 112). The organic mask is trimmed (step 116). The stair-step is etched (step 120). The trimming of the organic mask (step 116) and the stair-step etch (step 120) are cyclically repeated at least once. If the etch of the stair-step is not complete (step 128), then the process goes to depositing a hardmask (step 108). Otherwise, the process is complete and other steps may be performed.

Example

Figure 2A:
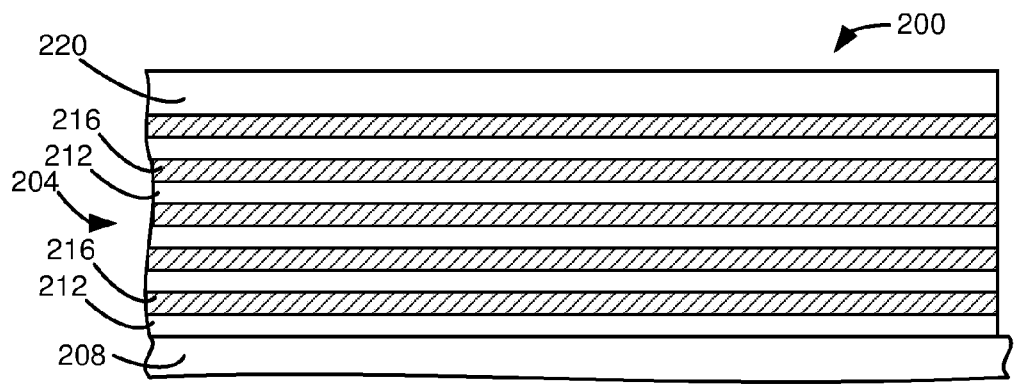
FIGS. 2A-L are schematic cross-sectional views of a memory stack formed according to an embodiment of the disclosure.

In an example of an implementation of the disclosure, a stair-step memory array is etched. In such a memory array, memory stacks are formed over a wafer. FIG. 2A is a cross sectional view of a plurality of layers of memory stacks 204 formed over a wafer 208. In this embodiment, each memory stack of the plurality of memory stacks are formed by bilayers of a layer of silicon oxide ($SiO_2$) 216 on top of a layer of silicon nitride (SiN) 212 forming an ONON substrate. An organic mask 220 is formed over the memory stacks 204 (step 104). The organic mask may be a photoresist mask that is formed using a spin on process and the photolithographic patterning. In the alternative, the organic mask may be a spun on or otherwise applied organic layer, without photolithographic patterning.

Figure 3:
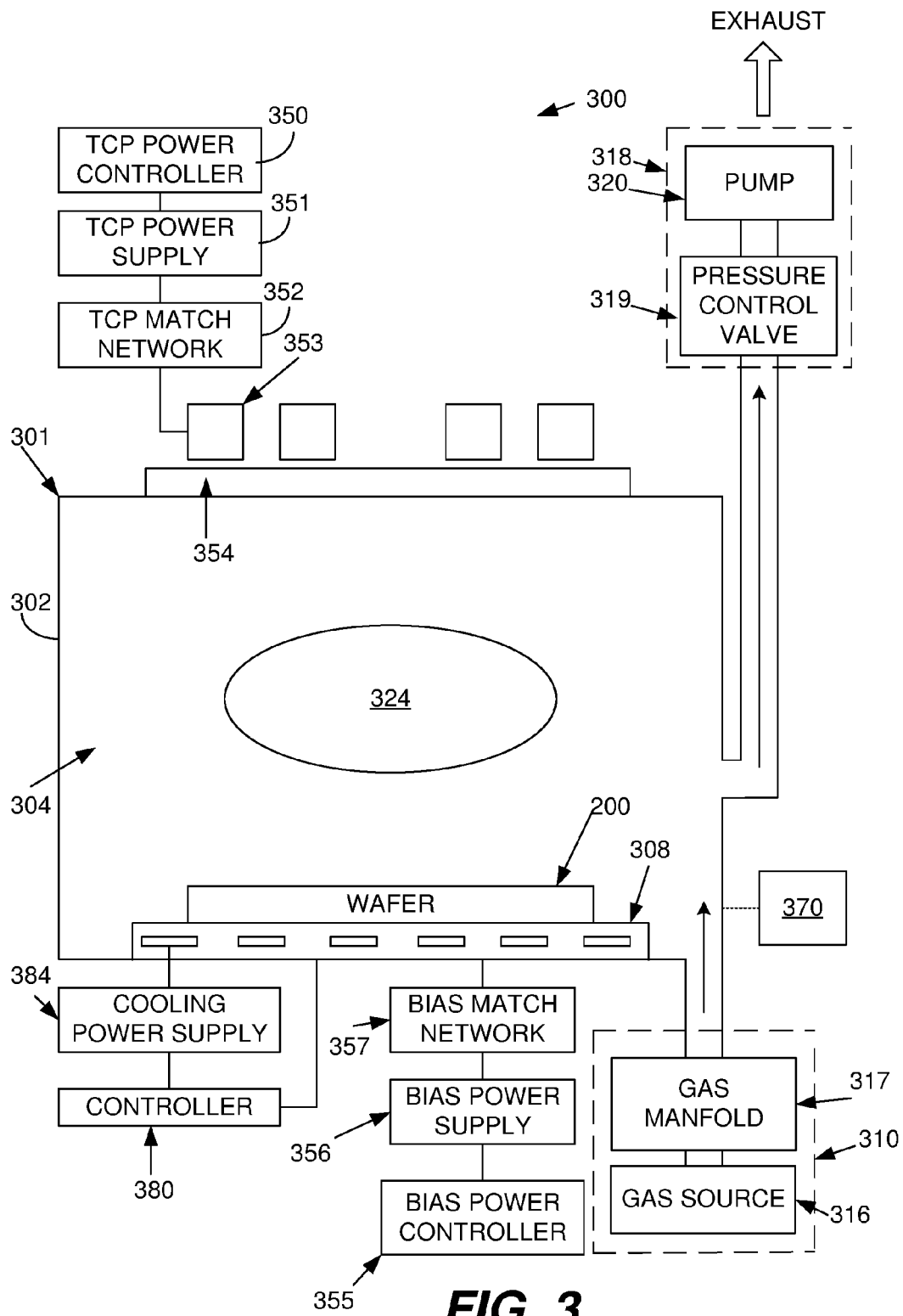
FIG. 3 is a schematic view of a plasma processing chamber that may be used in practicing the disclosure.

The wafer 208 may be placed in a processing tool to perform subsequent steps. FIG. 3 illustrates a processing tool that may be used in an implementation of the disclosure. FIG. 3 is a schematic view of a plasma processing system 300, including a plasma processing tool 301. The plasma processing tool 301 is an inductively coupled plasma etching tool and includes a plasma reactor 302 having a plasma processing chamber 304 therein. A transformer coupled power (TCP) controller 350 and a bias power controller 355, respectively, control a TCP power supply 351 and a bias power supply 356 influencing the plasma 324 created within plasma chamber 304.

The TCP power controller 350 sets a set point for TCP power supply 351 configured to supply a radio frequency signal at 13.56 MHz, tuned by a TCP match network 352, to a TCP coil 353 located near the plasma chamber 304. An RF transparent window 354 is provided to separate TCP coil 353 from plasma chamber 304, while allowing energy to pass from TCP coil 353 to plasma chamber 304.

The bias power controller 355 sets a set point for bias power supply 356 configured to supply an RF signal, tuned by bias match network 357, to a chuck electrode 308 located within the plasma chamber 304 creating a direct current (DC) bias above electrode 308 which is adapted to receive a wafer 200, such as the semi-conductor wafer work piece, being processed.

A gas supply mechanism or gas source 310 includes a source or sources of gas or gases 316 attached via a gas manifold 317 to supply the proper chemistry required for the process to the interior of the plasma chamber 304. A gas exhaust mechanism 318 includes a pressure control valve 319 and exhaust pump 320 and removes particles from within the plasma chamber 304 and maintains a particular pressure within plasma chamber 304.

A temperature controller 380 controls the temperature of a cooling recirculation system provided within the chuck electrode 308 by controlling a cooling power supply 384. The plasma processing system also includes electronic control circuitry 370. The plasma processing system may also have an end point detector. An example of such an inductively coupled system is the Kiyo built by Lam Research Corporation of Fremont, Calif., which is used to etch silicon, polysilicon and conductive layers, in addition to dielectric and organic materials. In other embodiments of the disclosure, a capacitively coupled system may be used.

Figure 4:
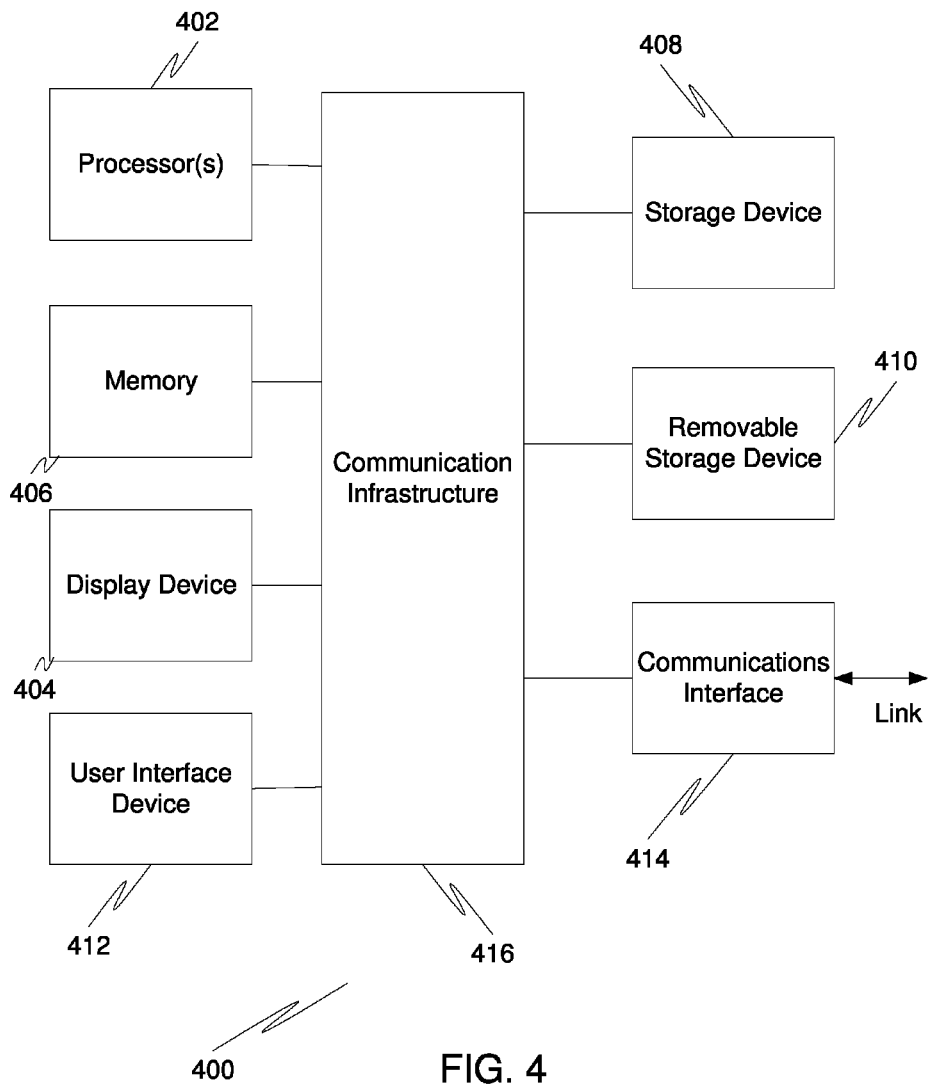
FIG. 4 illustrates a computer system, which is suitable for implementing a controller used in embodiments of the present disclosure.

FIG. 4 is a high level block diagram showing a computer system 400, which is suitable for implementing a control circuitry 370 used in embodiments of the present disclosure. The computer system may have many physical forms ranging from an integrated circuit, a printed circuit board, and a small handheld device up to a huge super computer. The computer system 400 includes one or more processors 402, and further can include an electronic display device 404 (for displaying graphics, text, and other data), a main memory 406 (e.g., random access memory (RAM)), storage device 408 (e.g., hard disk drive), removable storage device 410 (e.g., optical disk drive), user interface devices 412 (e.g., keyboards, touch screens, keypads, mice or other pointing devices, etc.), and a communication interface 414 (e.g., wireless network interface). The communication interface 414 allows software and data to be transferred between the computer system 400 and external devices via a link. The system may also include a communications infrastructure 416 (e.g., a communications bus, cross-over bar, or network) to which the aforementioned devices/modules are connected.

Information transferred via communications interface 414 may be in the form of signals such as electronic, electromagnetic, optical, or other signals capable of being received by communications interface 414, via a communication link that carries signals and may be implemented using wire or cable, fiber optics, a phone line, a cellular phone link, a radio frequency link, and/or other communication channels. With such a communications interface, it is contemplated that the one or more processors 402 might receive information from a network, or might output information to the network in the course of performing the above-described method steps. Furthermore, method embodiments of the present disclosure may execute solely upon the processors or may execute over a network such as the Internet in conjunction with remote processors that shares a portion of the processing.

The term "non-transient computer readable medium" is used generally to refer to media such as main memory, secondary memory, removable storage, and storage devices, such as hard disks, flash memory, disk drive memory, CD-ROM and other forms of persistent memory and shall not be construed to cover transitory subject matter, such as carrier waves or signals. Examples of computer code include machine code, such as produced by a compiler, and files containing higher level code that are executed by a computer using an interpreter. Computer readable media may also be computer code transmitted by a computer data signal embodied in a carrier wave and representing a sequence of instructions that are executable by a processor.

Figure 2B:
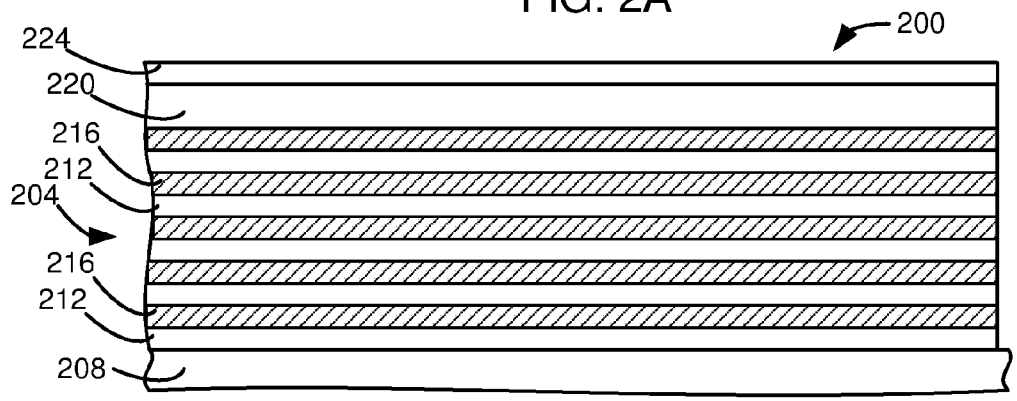
Figure 5:
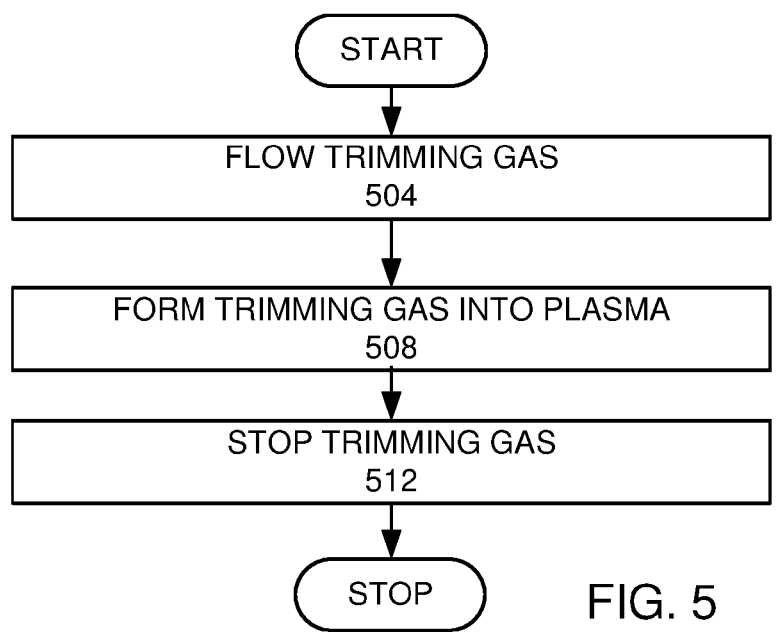
FIG. 5 is a more detailed flow chart of the step of trimming the organic mask.

In this example, a hardmask 224 is deposited over the organic mask 220, as shown in FIG. 2B (step 108). An example of a recipe for forming the hardmask layer 224 provided a pressure of 10 mTorr. A 13.56 MHz RF power source provided 300 watts of TCP power. A bias voltage source provided a 75 volt bias. A gas source provided a hardmask deposition gas comprising 50 sccm $SiCl_4$ and 100 sccm $O_2$. It should be noted that a bias may be provided in forming the hardmask layer to cause the thickness of the top layer to be thicker than the thickness of the sidewall layer. In this example, since the hardmask 224 is not deposited over sidewalls of the organic mask 220 in this cycle, the trimming of the hardmask (step 112) is skipped. The organic mask is trimmed (step 116). FIG. 5 is a more detailed flow chart of the step of trimming the organic mask (step 116). A trimming gas is flowed from the gas source 316 into the plasma chamber 304 (step 504). The trimming gas comprises $O_2$ and $N_2$. The trimming gas is formed into a plasma (step 508). After the organic mask 220 is sufficiently trimmed, the trimming gas is stopped (step 512).

Figure 2C:
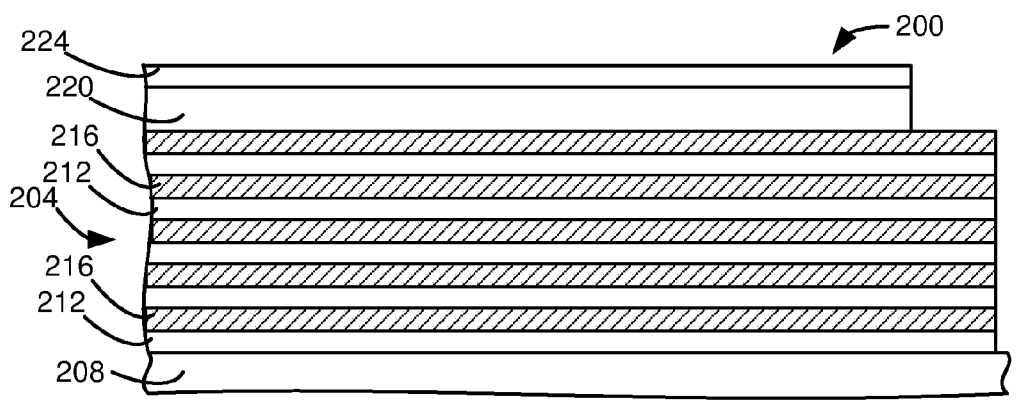

An example of a recipe for the trim of the organic mask provides a pressure between 80 to 400 mTorr. A trim gas is flowed from the gas source 316 to the plasma chamber 304 (step 504), where the trimming gas is 1000 sccm $O_2$, 30 sccm $N_2$, and 50 sccm $NF_3$. The trimming gas is formed into a plasma (step 508). In this example, 1800 watts TCP power is provided at 13.56 MHz. 0 volts of bias is provided. The plasma is maintained for 20 to 60 seconds, and then the trimming gas is stopped (step 512). FIG. 2C is a cross-sectional view of the stack, after the organic mask 220 is trimmed. The trimming of the organic mask 220 also removes part of the hardmask 224 above the part of the organic mask 220 that is trimmed away.

Figure 2D:
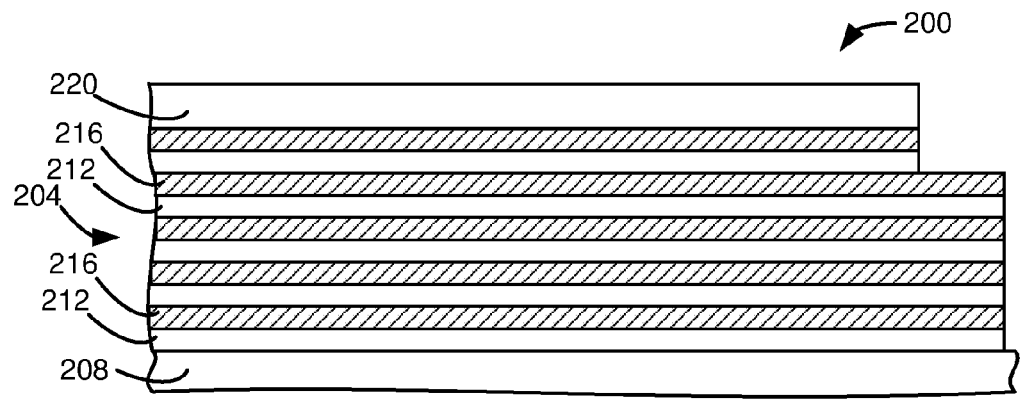

A stair-step is etched using the organic mask as a mask (step 120). FIG. 2D is a cross-sectional view of the stack after a stair-step has been etched. A recipe for etching the silicon oxide sublayer 216 of the stair-step provides a pressure of 10 mTorr. A flow of a etch gas of 40 sccm $O_2$, 300 sccm Ar, and 60 sccm $C_4F_6$ is provided from a gas source. The RF power source provided 1320 watts of TCP power. 500 volts of bias is provided. The process is provided for 10 seconds. A recipe for etching the silicon nitride sublayer 212 of the stair-step provides a pressure of 30 mTorr. A flow of a etch gas of 100 sccm $O_2$, 140 sccm $CH_3F$, and 30 sccm $CF_4$ is provided from a gas source. The RF power source provided 1800 watts of TCP power. 500 volts of bias is provided. The process is provided for 14 seconds.

Figure 2E:
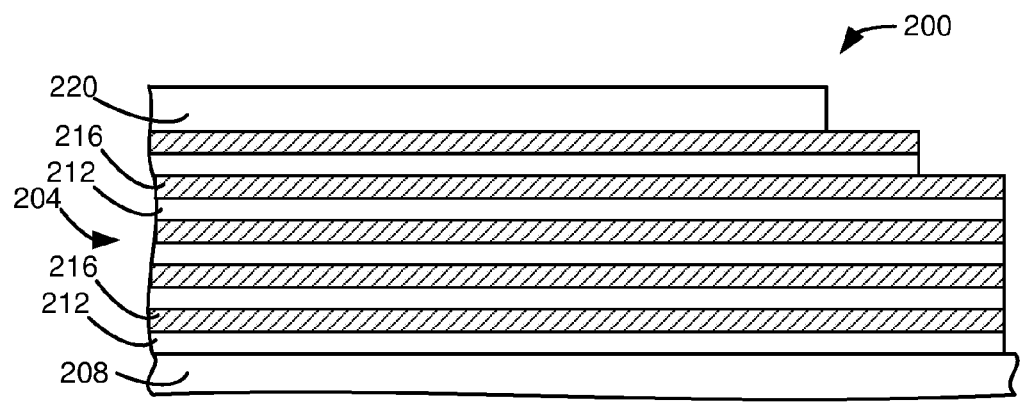
Figure 2F:
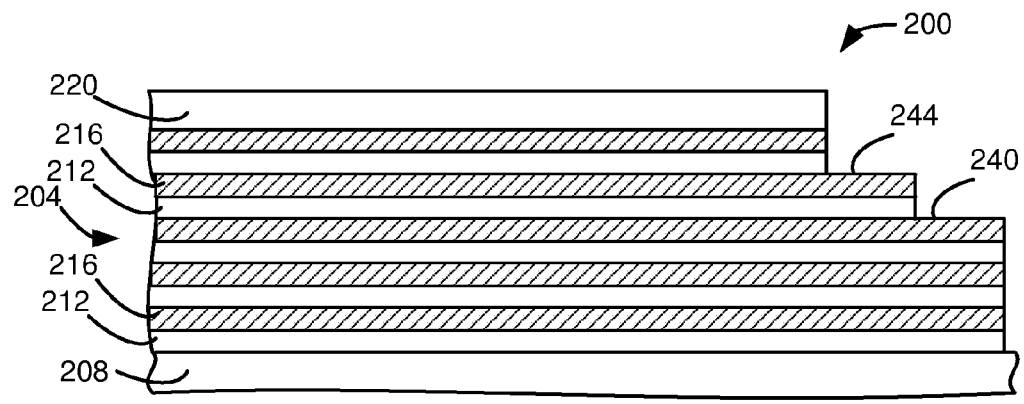

The hardmask has been etched away during the stair-step etch. It is determined that additional stair-steps are needed and a new hardmask is not needed (step 124), so the organic mask 220 is trimmed again (step 116). FIG. 2E is a cross-sectional view of the stack after the organic mask 220 is trimmed (step 116). The stair-steps are etched (step 120), as shown in FIG. 2F, forming a first step 240 and a second stair-step 244.

Figure 2G:
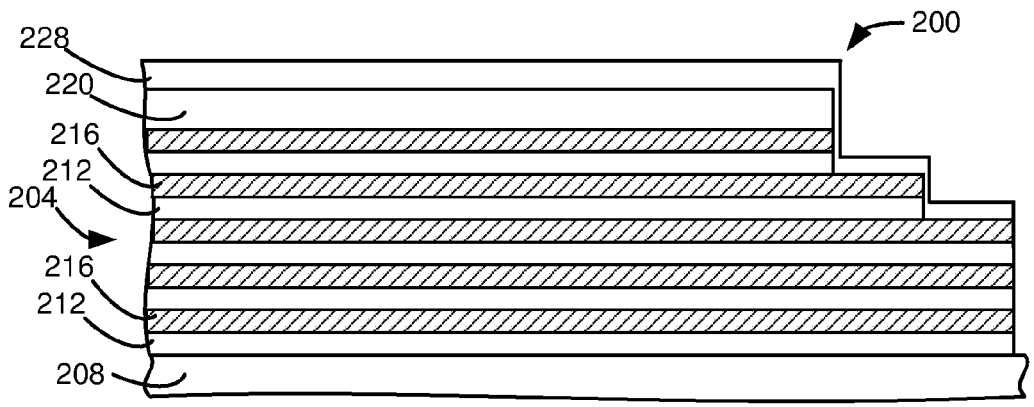
Figure 2H:
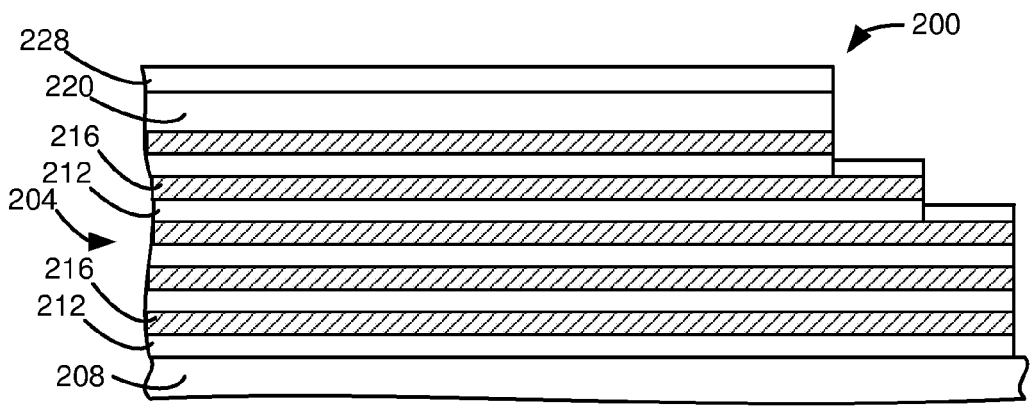

It is determined that additional stair-steps are needed and a new hardmask is needed (step 128), so a new hardmask is deposited (step 108). FIG. 2G is a cross-sectional view of the stack 200 after a new hardmask 228 has been deposited (step 108). In this example, some hardmask material has been deposited on the sidewalls of the organic mask 220. The hardmask 228 is subjected to a hardmask trim (step 112). One example of a recipe for trimming the hardmask provides a pressure of 70 mTorr. A trim gas of 500 sccm $NF_3$ and 200 sccm He is provided to the plasma processing chamber. A TCP RF signal of 800 Watts is provided to transform the trim gas into a trim plasma. FIG. 2H is a cross-sectional view of the stack 200 after the hardmask trim (step 112).

Figure 2I:
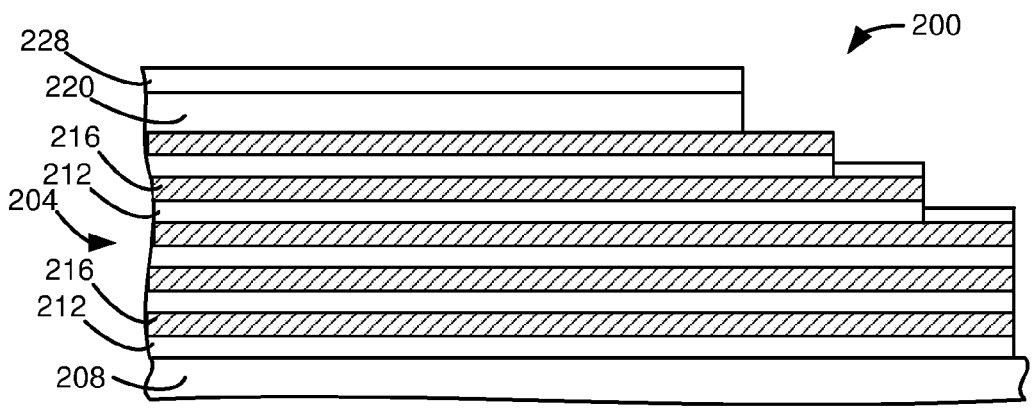
Figure 2J:
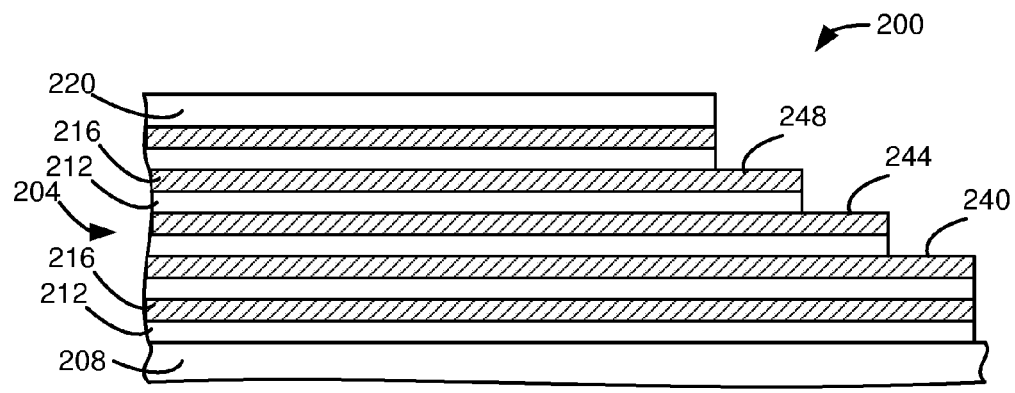
Figure 2K:
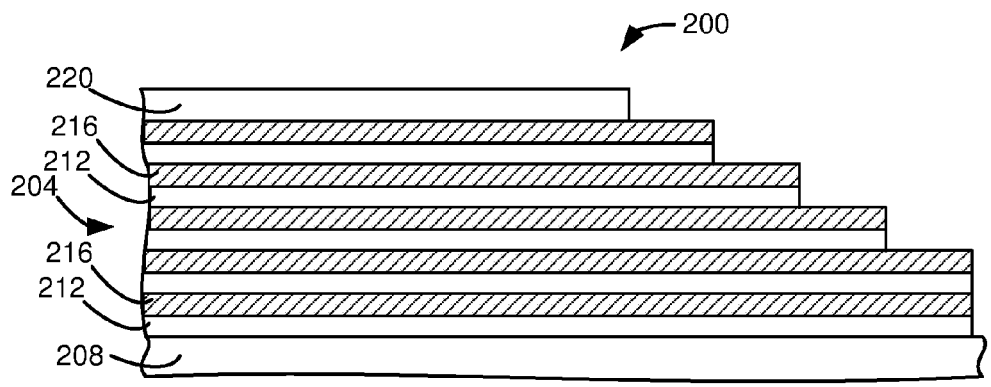
Figure 2L:
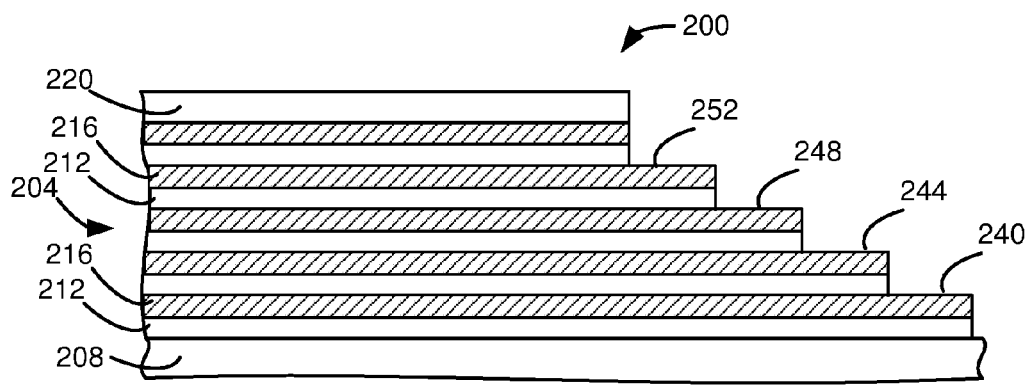

The organic mask is trimmed (step 116). FIG. 2I is a cross-sectional view of the stack 200 after the organic mask is trimmed (step 116). The stair-steps are etched (step 120), as shown in FIG. 2J, forming a third step 248 above the first step 240 and the second step 244. The hardmask is etched away during the stair-step etch. It is determined that additional stair-steps are needed and a new hardmask is not needed (step 124), so the organic mask 220 is trimmed again (step 116). FIG. 2K is a cross-sectional view of the stack after the organic mask 220 is trimmed (step 116). The stair-steps are etched (step 120), as shown in FIG. 2L, forming a fourth step 252 above the first stair-step 240, the second stair-step 244, and the third stair-step 248.

If no additional stair-steps are needed (step 128), the cyclical process is complete. Additional steps may be provided for further processing. For example, the organic mask 220 may be stripped, resulting in a memory stack with five stair-steps counting the top layer. The additional steps, such as stripping the organic mask, may be done in the same chamber before removing the substrate from the chamber, or the substrate may be removed from the chamber to perform the additional steps. This embodiment allows the trimming of the organic mask, the removing the residue, and the etching of the substrate to be performed in the same chamber, so that the same plasma reactor, power supply, coil/electrode, and chuck electrode are used in all of the steps.

The hardmask allows the organic mask to be trimmed with less thinning of the organic mask, so that a large number of stair-steps may be provided. Preferably, the cycle is repeated at least 3 times, so that at least five stair-steps are provided. More preferably, at least 8 stair-steps may be provided with a single organic mask forming process. More preferably, more than twenty stair-steps may be provided using a single organic mask process. The stair-steps may be formed in one or more directions in other embodiments. In one example, a stair-step structure was created with thirty-two steps.

In this embodiment, the trimming of the organic mask has a vertical to lateral ratio of less than 0.8. More preferably, the trimming of the organic mask has a vertical to lateral ratio of less than 0.5. The hardmask is selectively deposited on top of the organic mask with respect to the sidewalls of the organic mask, so that the deposited layer is thicker on top of the organic mask than on the sidewalls of the organic mask. In some embodiments, the depositing the hardmask deposits a top layer on top of the organic mask and a sidewall on the side of the organic mask, where the top layer of the hardmask has a thickness that is greater than a thickness of the sidewall. More preferably, the thickness of the top layer is at least 1.5 times the thickness of the sidewalls.

Figure 6:
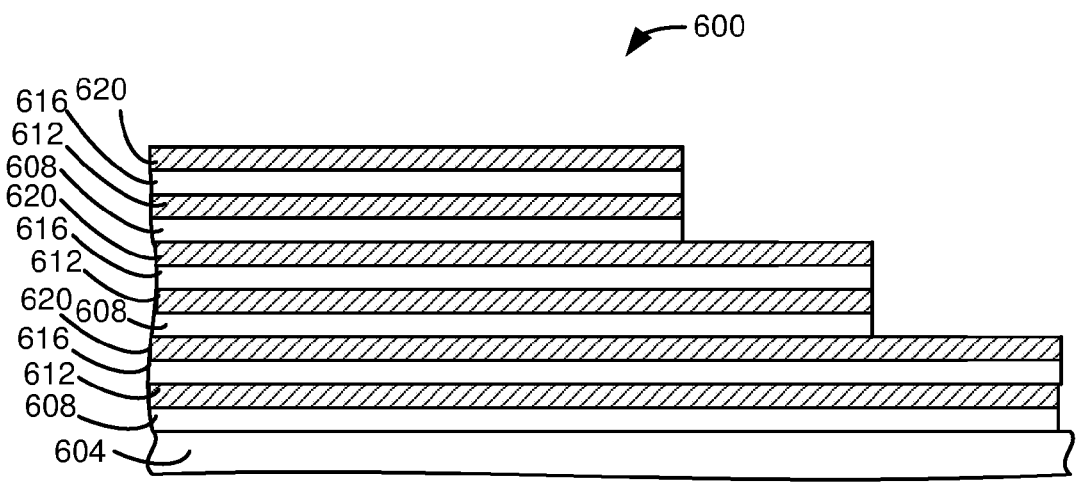
FIG. 6 is a schematic cross-sectional view of a memory stack formed according to another embodiment.

In other embodiments, the substrate may be made of other materials, to be etched, or the substrate may be a solid piece of a single material. In a preferred embodiment, the substrate comprises a plurality of layers where each layer comprises at least two sublayers used to form the memory stacks of the substrate. In one example, at least one sublayer is silicon oxide. In another example, each layer comprises three sublayers. In other embodiments, other trim gases may be used in addition to or in place of $O_2$. FIG. 6 is a cross-sectional view of a stair-step structure over a wafer 604 that has been etched using an embodiment, where each stair-step comprises a first sublayer 608, a second sublayer 612, a third sublayer 616, and a fourth sublayer 620. In another embodiment, the substrate may be a continuous single layer. In different embodiments, the substrate may be alternating layers of sublayers of silicon oxide and polysilicon (OPOP). In another embodiment, each stair-step may be formed from three sublayers.

In some embodiments, cycles are performed so that a hardmask is deposited at least three times. In other embodiments, cycles are performed so that the hardmask is deposited at least five times.

Since various embodiments may provide different numbers of etch cycles between hardmask depositions, and since the number of etch cycles may vary between hardmask depositions in an embodiment, the number of etch cycles between hardmask deposition may be an additional control parameter. This control parameter may be used to tailor a recipe to specific etch requirements.

An embodiment comprises at least one cycle, wherein the at least one cycle comprises a protected etch phase and an unprotected etch phase. In an embodiment, the protected etch phase comprises depositing a hardmask over the organic mask, trimming the organic mask, and then etching the substrate. The unprotected etch phase comprises trimming the organic mask, where the organic mask is not protected by a hardmask, and then etching the substrate. In an embodiment, the cycle is repeated at least five times. In some embodiments the protected etch phase proceeds the unprotected etch phase. In other embodiments, the unprotected etch phase proceeds the protected etch phase.

In processes that deposit a hardmask before each organic mask trim, subsequent hardmask removal and organic mask smoothing steps are needed. Without the smoothing steps, the deposition of the hardmask for each etch cycle causes organic mask roughening each cycle. One reason for the roughening is that pinholes would develop without a hardmask clean and a smoothing step. The addition of organic mask smoothing steps increases process time. It has been found that in the above embodiments, the absence of a hardmask removal step and the requirement for an organic mask trim and the vertical etching of the organic mask layer, when there is no hardmask over the organic mask smoothes the organic mask, so that a separate organic mask smoothing step is not needed. More specifically, it has been found that trimming the organic mask without a hardmask smoothens the organic mask, so that a separate organic mask smoothing step is not needed. Such a trimming will cause thinning of the organic mask. It has also been found that various embodiments provide a lower lateral to vertical etch ratio than processes that provide a hardmask for each etch cycle.

The process in an embodiment of the disclosure also provides a faster process than a process that provides a hardmask over the organic mask layer every etch cycle. This is done by eliminating the hardmask formation step for some of the etch cycles. This provides for a faster throughput. The reduced organic thinning allows for either more steps to be etched with a given organic mask layer, or a reduced organic mask thickness, which increases resolution. Removing the hardmask as part of the stair-step etch eliminates time needed to remove the hardmask.

While this disclosure has been described in terms of several preferred embodiments, there are alterations, permutations, and various substitute equivalents, which fall within the scope of this disclosure. It should also be noted that there are many alternative ways of implementing the methods and apparatuses of the present disclosure. It is therefore intended that the following appended claims be interpreted as including all such alterations, permutations, and various substitute equivalents as fall within the true spirit and scope of the present disclosure.

What is claimed is:

1. A method for forming a stair-step structure in a substrate in a plasma processing chamber, wherein the substrate has an organic mask, comprising at least one cycle, wherein each cycle comprises:
    a) depositing a hardmask over the organic mask;
    b) trimming the organic mask;
    c) etching the substrate;
    d) trimming the organic mask, wherein there is no depositing a hardmask between etching the substrate and trimming the organic mask; and
    e) etching the substrate.

2. The method, as recited in claim 1, further comprising repeating steps a-e a plurality of times forming the stair-step structure.

3. The method, as recited in claim 2, wherein steps d and e are cyclically repeated at least once for each cycle of steps a-e.

4. The method, as recited in claim 3, wherein each cycle of steps a-e is repeated at least 5 times.

5. The method, as recited in claim 4, wherein the depositing the hardmask deposits hardmask on sidewalls of the organic mask further comprising trimming the hardmask between steps a and b.

6. The method, as recited in claim 5, wherein the organic mask is a photoresist mask.

7. The method, as recited in claim 6, wherein steps a-e are performed in a single plasma processing chamber.

8. The method, as recited in claim 7, wherein the substrate comprises a plurality of layers, wherein each layer comprises at least two sublayers.

9. The method, as recited in claim 8, wherein at least one of the at least two sublayers is a silicon oxide containing layer.

10. The method, as recited in claim 1, wherein the depositing the hardmask deposits a top layer on top of the organic mask and a sidewall on the side of the organic mask and wherein the top layer of the hardmask has a thickness that is thicker than a thickness of the sidewall of the hardmask and further comprising trimming the hardmask between steps a and b.

11. The method, as recited in claim 1, wherein step d smoothes the organic mask.

12. The method, as recited in claim 1, wherein step c completely removes the hardmask, and wherein steps d and e are performed without a hardmask, and wherein step d partially etches the organic mask.

13. A method for making a three dimensional memory structure from a memory stack comprising a plurality of layers, wherein each layer comprises at least two sublayers and wherein an organic mask is over the memory stack, comprising:
    a) depositing a hardmask over a top of the organic mask;
    b) trimming the organic mask;
    c) etching the memory stack, so that portions of the memory stack not covered by the organic mask are etched a depth of the thickness of at least one layer of the plurality of layers;
    d) trimming the organic mask, wherein there is no depositing a hardmask between steps c and d;
    e) etching the memory stack; and
    f) repeating steps a-e a plurality of times forming the three dimensional memory structure.

14. The method, as recited in claim 13, further comprising cyclically repeating steps d and e at least once before performing step f.

15. The method, as recited in claim 13, wherein the depositing the hardmask deposits a sidewall layer on a sidewall of the organic mask, further comprising removing the sidewall layer of the hardmask.

16. The method, as recited in claim 15, wherein a thickness of the top layer of the hardmask is greater than a thickness of the sidewall layer of the hardmask.

17. The method, as recited in claim 16, wherein the organic mask is a photoresist mask.

18. The method, as recited in claim 17, wherein steps a-f are performed in a single plasma processing chamber.

* * * * *